United States Patent [19]
Kobayashi et al.

[11] Patent Number: 5,679,964
[45] Date of Patent: Oct. 21, 1997

[54] OPTOELECTRONIC INTEGRATED DEVICE

[75] Inventors: Yasuhiro Kobayashi, Osaka; Kenichi Matsuda, Moriguchi, both of Japan

[73] Assignee: Matsushita Electric Industrial Co., Ltd., Kadoma, Japan

[21] Appl. No.: 498,096

[22] Filed: Jul. 5, 1995

[30] Foreign Application Priority Data

Jul. 7, 1994 [JP] Japan .................. 6-156091

[51] Int. Cl.⁶ .................................. H01L 27/15
[52] U.S. Cl. .................. 257/83; 257/13; 257/85; 257/190; 372/50
[58] Field of Search .................. 257/13, 18, 21, 257/23, 83, 85, 190; 372/50

[56] References Cited

U.S. PATENT DOCUMENTS

| | | | |
|---|---|---|---|
| 5,216,686 | 6/1993 | Holm et al. | 372/50 |
| 5,283,447 | 2/1994 | Olbright et al. | 257/85 |
| 5,387,796 | 2/1995 | Joshi et al. | 257/190 |
| 5,393,994 | 2/1995 | Kobayashi et al. | 257/85 |
| 5,408,105 | 4/1995 | Adachi et al. | 257/13 |

FOREIGN PATENT DOCUMENTS

| | | | |
|---|---|---|---|
| 60-239082 | 11/1985 | Japan | 372/50 |
| 5243552 | 9/1993 | Japan . | |

*Primary Examiner*—Mahshid D. Saadat
*Assistant Examiner*—Courtney A. Bowers
*Attorney, Agent, or Firm*—Renner, Otto, Boisselle, Sklar

[57] ABSTRACT

The optoelectronic integrated device includes a semiconductor substrate, a vertical-cavity surface-emitting semiconductor laser formed on the semiconductor substrate, a phototransistor stacked over the vertical-cavity surface emitting semiconductor laser, for driving the vertical-cavity surface-emitting semiconductor laser, and a semiconductor buffer structure interposed between the vertical-cavity surface-emitting semiconductor laser and the phototransistor. The vertical-cavity surface-emitting semiconductor laser includes: a bottom semiconductor mirror; a top semiconductor mirror; and an active region interposed between the bottom semiconductor mirror and the top semiconductor mirror and having a strained quantum well structure for emitting light having a wavelength of $\lambda$. The phototransistor includes: a collector layer; an emitter layer; and a base layer interposed between the collector layer and the emitter layer and absorbing light having a wavelength of $\lambda$. The semiconductor buffer structure includes: a first surface facing the phototransistor and having a lattice constant substantially lattice-matching with the base layer, and a second surface facing the vertical-cavity surface-emitting semiconductor laser.

15 Claims, 9 Drawing Sheets

OPTOELECTRONIC INTEGRATED DEVICE

BACKGROUND OF THE INVENTION

1. Field of the Invention

The present invention relates to an optoelectronic integrated device including a light-emitting element and an active element.

2. Description of the Related Art

In recent years, an optoelectronic integrated device including a light-emitting element and an active element has been developed for use as a key device for processing optical information and optical interconnection. It is expected that a vertical-cavity surface-emitting semiconductor laser is a promising device as a light-emitting element used in such an optoelectronic integrated device. This is because a vertical-cavity surface-emitting semiconductor laser can emit a laser beam from the surface of a semiconductor substrate, and such a feature is suitable for realizing a two-dimensional emitting array and interconnecting other elements easily.

Japanese Laid-Open Patent Publication No. 5-243552 discloses an optoelectronic integrated circuit in which such a vertical-cavity surface-emitting semiconductor laser and a heterojunction bipolar transistor as a driver thereof are stacked. As shown in FIG. 13, in the optoelectronic integrated circuit, unit cells 604 consisting of a surface-emitting semiconductor laser 602 and a heterojunction bipolar transistor 603 are arranged in a two-dimensional array on a p-type GaAs semiconductor substrate 601.

The surface-emitting semiconductor laser 602 includes: a p-type reflector 605, a light-emitting portion 606 having an InGaAs/GaAs strained quantum well, and an n-type reflector 607. The heterojunction bipolar transistor 603 includes: a collector 608 made of n-type GaAs, a base 609 made of p-type GaAs, and an emitter 610 made of n-type AlGaAs. An emitter electrode 611 and a base electrode 613 are formed on the emitter 610 and the base 609, respectively. The respective emitter electrodes 611 of the unit cells 604 adjacent to each other in a lateral direction in FIG. 13 are connected to each other by corresponding row lines 612. The respective base electrodes 613 of the unit cells 604 adjacent to each other in a longitudinal direction in FIG. 13 are connected to each other by respective column lines 614.

The row lines 612 and the column lines 614 are separated from each other by an interlevel insulating film 615 made of polyimide or the like. An anode of the surface-emitting semiconductor laser 602 is connected to the semiconductor substrate 601 inside the crystal, and the semiconductor substrate 601 is grounded via a substrate electrode 616. Light 617 emitted from the surface-emitting semiconductor laser 601 so as to be emitted from the bottom side of the semiconductor substrate 601.

The operation of this optoelectronic integrated circuit will be described below. As described above, the anode of the surface-emitting semiconductor laser 602 is grounded. Therefore, if a negative bias voltage $-V_{EE}$ is applied to the row line 612 connected to the emitter 610 of the heterojunction bipolar transistor 603, and if a voltage V higher than $-V_{EE}$ but lower than 0 is applied to the column line 614 connected to the base 609, then the surface-emitting semiconductor laser 602 located at the intersection can emit light.

The above-identified patent publication discloses that, when such an optoelectronic integrated circuit is coupled with an optical fiber; by selecting one particular surface-emitting semiconductor laser having an optical axis appropriately aligned with that of the optical fiber from a plurality of surface-emitting semiconductor lasers arranged in an two-dimensional array, it is not necessary to precisely position the optical fiber and the optoelectronic integrated circuit. As disclosed by the patent publication, in order to determine a unit cell 604 including the particular surface-emitting semiconductor laser; by using a base-emitter junction of the heterojunction bipolar transistor 603 as a photodetector, the optoelectronic integrated circuit is coupled with the optical fiber, light is made to be incident onto the heterojunction bipolar transistor 603, and then the intensity of the incident light from the optical fiber is detected by the heterojunction bipolar transistor 603.

In the conventional optoelectronic integrated circuit described above, the surface-emitting semiconductor laser 602 is driven by an electric signal input to the heterojunction bipolar transistor 603. Therefore, it is impossible for the conventional optoelectronic integrated circuit described above to drive the surface emitting semiconductor laser by inputting the light emitted from the light-emitting element to the active element as an input signal.

The above-identified patent publication also discloses that the heterojunction bipolar transistor is used as a photodetector in determining a particular surface-emitting semiconductor laser having an optical axis aligned with that of the optical fiber. However, the heterojunction bipolar transistor is not used for driving the surface-emitting semiconductor laser. In addition, since the wavelength of the light irradiated onto the heterojunction bipolar transistor is required to be shorter than that of the light absorbed by GaAs, the heterojunction bipolar transistor can not respond to the light emitted from the light-emitting portion 606 having an InGaAs/GaAs strained quantum well of the surface-emitting semiconductor laser.

Therefore, the optoelectronic integrated circuit described above can not process optical information by directly connecting a plurality of optoelectronic integrated circuits and form an optical interconnection.

SUMMARY OF THE INVENTION

The optoelectronic integrated device of the present invention includes a semiconductor substrate, a vertical-cavity surface-emitting semiconductor laser formed on the semiconductor substrate, a phototransistor stacked over the vertical-cavity surface-emitting semiconductor laser for driving the vertical-cavity surface-emitting semiconductor laser, and a semiconductor buffer structure interposed between the vertical-cavity surface-emitting semiconductor laser and the phototransistor. The vertical-cavity surface-emitting semiconductor laser includes: a bottom semiconductor mirror, a top semiconductor mirror, and an active region interposed between the bottom semiconductor mirror and the top semiconductor mirror and having a strained quantum well structure for emitting light having a wavelength of $\lambda$. The phototransistor includes: a collector layer, an emitter layer, and a base layer interposed between the collector layer and the emitter layer and absorbing light having a wavelength of $\lambda$. The semiconductor buffer structure includes: a first surface facing the phototransistor and having a lattice constant substantially lattice-matching with the base layer, and a second surface facing the vertical-cavity surface-emitting semiconductor laser.

According to another aspect of the invention, an optoelectronic integrated circuit is provided. The optoelectronic integrated circuit includes: a semiconductor substrate, a plurality of the optoelectronic integrated devices arranged in a two-dimensional array along a first direction and a second direction on the semiconductor substrate, a plurality of first lines for electrically connecting to each other the base layers of the phototransistors of the plurality of optoelectronic integrated devices which are adjacent to each other along the first direction, and a plurality of second lines for electrically connecting to each other the emitter layers of the phototransistors of the plurality of optoelectronic integrated devices which are adjacent to each other along the second direction.

In one embodiment of the invention, the semiconductor substrate is made of a material substantially transmitting the light having the wavelength of $\lambda$.

In another embodiment of the invention, the active region has the strained quantum well structure comprising an InGaAs layer and a GaAs layer and the collector layer and the base layer are formed of InGaAs layers.

In still another embodiment of the invention, the emitter layer is formed by an InAlAs layer.

In still another embodiment of the invention, the semiconductor buffer structure is formed by an $In_xGa_{1-x}As$ layer having a composition ratio x of In and a composition ratio 1-x of Ga, varying continuously or in discrete steps from the second surface to the first surface of the semiconductor buffer structure so that a composition of the semiconductor buffer structure has the composition ratio x of zero on the second surface and becomes equal to a composition of the collector layer on the first surface.

In still another embodiment of the invention, the semiconductor buffer structure has a superlattice structure in which at least two of an $Al_xGa_{1-x}As$ layer (where, $0 \leq x \leq 1$), an $In_yGa_{1-y}As$ layer (where, $0 \leq y \leq 1$), and an $In_zAl_{1-z}As$ layer (where, $0 \leq z \leq 1$) are alternately stacked.

In still another embodiment of the invention, the optoelectronic integrated device is driven so that an electric current flows through the phototransistor when the light having the wavelength of $\lambda$ is incident on the baser layer and that the light having the wavelength of $\lambda$ is emitted from the vertical-cavity surface-emitting semiconductor laser.

In still another embodiment of the invention, a part of the light having the wavelength of $\lambda$ emitted from the vertical-cavity surface-emitting semiconductor laser is internally fed back to the base layer.

In still another embodiment of the invention, the light emitted from the vertical-cavity surface-emitting semiconductor laser shows a bistable state with respect to the light incident on the base layer.

By providing a semiconductor buffer structure including a first surface facing a phototransistor and having a lattice constant substantially lattice-matching with a base layer of the phototransistor and a second surface facing a vertical-cavity surface-emitting semiconductor laser between the vertical-cavity surface-emitting semiconductor laser including an active region having a strained quantum well structure and emitting light having a wavelength of $\lambda$ and the phototransistor responding to the light having the wavelength of $\lambda$; a phototransistor formed by a semiconductor layer which does not lattice-match with a semiconductor substrate can be formed above semiconductor layers constituting the vertical-cavity surface-emitting semiconductor laser on the semiconductor substrate.

As a result, light having the same wavelength as the wavelength of the incident light can be emitted from the optoelectronic integrated device and a plurality of optoelectronic integrated devices can be connected in series. In addition, the light emitted from the vertical-cavity surface-emitting semiconductor laser towards the phototransistor functions as internal feedback light, so that the internal resistance of the optoelectronic integrated device shows negative resistivity. Consequently, two stable states comes to exist with respect to an appropriate load, and therefore, an optical bistable characteristic is realized in the optoelectronic integrated device.

Moreover, since the substrate is transparent with respect to the light oscillated by the vertical-cavity surface-emitting semiconductor laser, it is possible to receive the incident light from the top surface of the semiconductor substrate on which the optoelectronic integrated device is formed and emit the light from the bottom surface of the substrate by stacking the heterojunction phototransistor on the vertical-cavity surface-emitting semiconductor laser.

According to the present invention, it is possible to provide; optoelectronic integrated devices which respond to the light having the same wavelength as that of the emitted light and can be connected in series to each other, and an optoelectronic integrated circuit including a plurality of such optoelectronic integrated devices. In addition, since the optoelectronic integrated device of the invention exhibits an optical bistable characteristic, an optoelectronic integrated device and an optoelectronic integrated circuit including a plurality of such optoelectronic integrated devices functioning as an optical processor can be obtained.

Thus, the invention described herein makes possible the advantage of providing an optoelectronic integrated device in which a vertical-cavity surface-emitting semiconductor laser using a strained quantum well as an active layer and a phototransistor for detecting the light emitted from the laser are integrated.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

Figure 1:
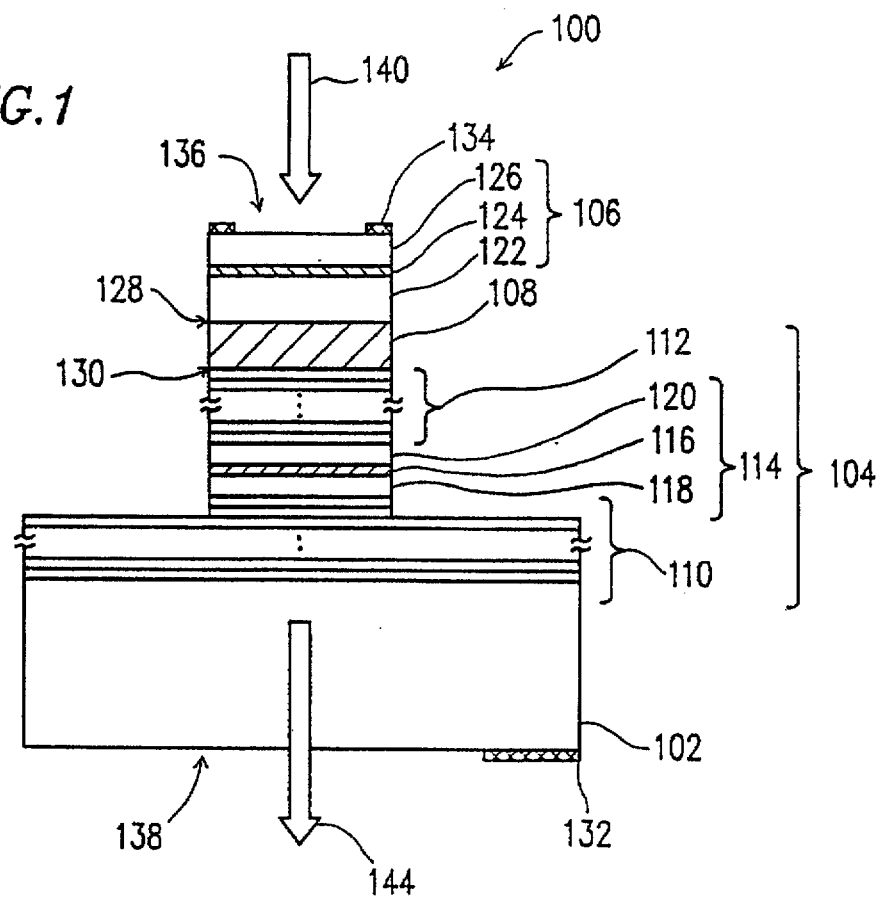
FIG. 1 is a schematic cross-sectional view of an optoelectronic integrated device according to a first example of the present invention.

FIG. 1 is a schematic cross-sectional view of an optoelectronic integrated device 100 according to a first example of the present invention. Table 1 shows the compositions, the thicknesses and the impurity concentrations of the respective semiconductor layers constituting the optoelectronic integrated device 100.

The optoelectronic integrated device 100 includes: a semiconductor substrate 102, a vertical-cavity surface-emitting semiconductor laser 104 formed on the semiconductor substrate 102, a phototransistor 106, and a semiconductor buffer structure 108 provided between the vertical cavity surface emitting semiconductor laser 104 and the phototransistor 106.

The semiconductor substrate 102 is made of p-type GaAs and the lattice constant of GaAs having a bulk structure is 5.65 Å.

The vertical-cavity surface-emitting semiconductor laser 104 includes: a bottom semiconductor mirror 110 formed on the semiconductor substrate 102, a top semiconductor mirror 112, and an active region 114 interposed between the bottom semiconductor mirror 110 and the top semiconductor mirror 112. The bottom semiconductor mirror 110 has a multi-layered structure obtained by alternately stacking 24.5 pairs of p-type GaAs layers and p-type AlAs layers, thereby forming a Distributed Bragg Reflector. In the same way, the top semiconductor mirror 112 also has a multi-layered structure obtained by alternately stacking 24.5 pairs of n-type GaAs layers and n-type AlAs layers, thereby forming a Distributed Bragg Reflector.

The active region 114 includes a strained quantum well 116 and two cladding layers 118 and 120 interposing the strained quantum well 116, and has a strained quantum well structure. More specifically, as shown in Table 1, the strained quantum well 116 includes a pair of barrier layers made of GaAs and a well layer interposed between the barrier layers. The well layer is made of $In_{0.2}Ga_{0.8}As$ which has a smaller bandgap than that of GaAs. Since GaAs and $In_{0.2}Ga_{0.8}As$ respectively have a lattice constant of 5.65 Å and 5.98 Å in the bulk structures thereof, the well layer made of $In_{0.2}Ga_{0.8}As$ in a bulk state does not lattice-match with a semiconductor layer made of GaAs. However, since the well layer has a thickness equal to or smaller than the critical film thickness at which a bulk property is no longer exhibited, the well layer is epitaxially grown on the barrier layer as a strained layer not having a misfit dislocation. The strained quantum well 116 having a strained structure oscillates light having a wavelength of 0.98 μm, and the semiconductor substrate 102 is transparent with respect to this light.

Of these semiconductor layers constituting the vertical-cavity surface-emitting semiconductor laser 104, all the layers but the well layer of the strained quantum well 116 have substantially the same lattice constant as that of the semiconductor substrate 102, and therefore the layers lattice-match with the semiconductor substrate 102.

The phototransistor 106 includes a collector layer 122, an emitter layer 126, and a base layer 124 interposed between the collector layer 122 and the emitter layer 126. The collector layer 122 and the base layer 124 are made of n-type $In_{0.53}Ga_{0.47}As$ and p-type $In_{0.53}Ga_{0.47}As$, respectively. The base layer 124 absorbs light having substantially the same wavelength as that of the light emitted from the strained quantum well 116. The emitter layer 126 is made of n-type $In_{0.52}Al_{0.48}As$ having a bandgap larger than that of the base layer 124, and a hetero-junction is formed in the interface between the base layer 124 and the emitter layer 126. Both the collector layer 122 and the emitter layer 126 lattice match with the base layer 124 and have substantially the same lattice constant.

The semiconductor buffer structure 108 is made of $In_xGa_{1-x}As$, where the composition ratio x of In and the

TABLE 1

| Semiconductor layer | Composition | Thickness (nm) | Impurity concentration (cm$^{-3}$) |
|---|---|---|---|
| Bottom semicondcutor mirror 110 | p-GaAs/p-AlAs | 69.6/82.8 | Be: $3 \times 10^{1A}$ |
| Cladding layer 118 | p-Al$_{0.5}$Ga$_{0.5}$As | 136 | Be: $1.5 \times 10^{1B}$ |
| Strained quantum well 116 | | | |
| Barrier layer | u-GaAs | 10 | |
| Well layer | u-In$_{0.2}$Ga$_{0.8}$As | 8 | |
| Barrier layer | u-GaAs | 10 | |
| Cladding layer 120 | n-Al$_{0.5}$Ga$_{0.5}$As | 136 | Si: $1.5 \times 10^{18}$ |
| Top semiconductor mirror 112 | n-GaAs/n-AlAs | 69.6/82.8 | Si: $3 \times 10^{18}$ |
| Semiconductor buffer structure 108 | n-In$_x$Ga$_{1-x}$As | 1000 | Si: $3 \times 10^{18}$ |
| Collector layer 122 | n-In$_{0.53}$Ga$_{0.47}$As | 300 | Si: $5 \times 10^{18}$ |
| Base layer 12A | p-In$_{0.53}$Ga$_{0.47}$As | 100 | Be: $5 \times 10^{18}$ |
| Emitter layer 126 | n-In$_{0.52}$Al$_{0.48}$As | 150 | Si: $3 \times 10^{17}$ | composition ratio of 1-x of Ga, vary continuously or in discrete steps from a first surface 128 facing the − phototransistor 106 to a second surface 130 facing the vertical-cavity surface-emitting semiconductor laser 104. More specifically, x is 0.53 on the first surface 128 and x is 0 on the second surface 130. Therefore, the semiconductor buffer structure 108 on the first surface 128 is made of the same semiconductor material as that of the collector layer 122 or the base layer 124, and has a lattice constant substantially lattice-matching with the base layer 124. On the other hand, the semiconductor buffer structure 108 on the second surface 130 is made of GaAs, and therefore lattice-matches with the top semiconductor mirror 112 of the vertical-cavity surface-emitting semiconductor laser 104. Also, since the semiconductor composition varies continuously or gradually in the semiconductor buffer structure 108, the internal strain caused by lattice-mismatch has been sufficiently relieved.

The optoelectronic integrated device 100 further includes a p-type electrode 132 and an n-type electrode 134. The p-type electrode 132 is formed so as to provide an opening 138 for the bottom surface of the semiconductor substrate 102, and the n-type electrode 134 is formed so as to provide an opening 136 for the top surface of the emitter layer 126.

The optoelectronic integrated device 100 is fabricated by utilizing a conventional technology for fabricating a semiconductor device. First, the semiconductor layers 110, 114, 112, 108, 122, 124 and 126 are epitaxially grown on the semiconductor substrate 102 by using a metalorganic chemical vapor deposition (MOCVD) method, a molecular beam epitaxy (MBE) method or the like. The well layer of the strained quantum well 116 is made of a material not lattice-matching with the semiconductor substrate 102. However, if the thickness of the well layer is equal to or smaller than the critical film thickness, then the well layer can be epitaxially grown without generating a misfit dislocation. Next, the cladding layer 120 and the top semiconductor mirror 112 which lattice-match with the semiconductor substrate 102 are formed on the strained quantum well 116. Subsequently, after the semiconductor buffer structure 108 has been grown while varying the composition ratios of In and Ga, the collector layer 122, the base layer 124 and the emitter layer 126 which lattice-match with the first surface 128 of the semiconductor buffer structure 108 are epitaxially grown. Thereafter, by forming a mesa reaching the bottom semiconductor mirror 110, the p-type electrode 132 and the n-type electrode 134 are formed.

Figure 2:
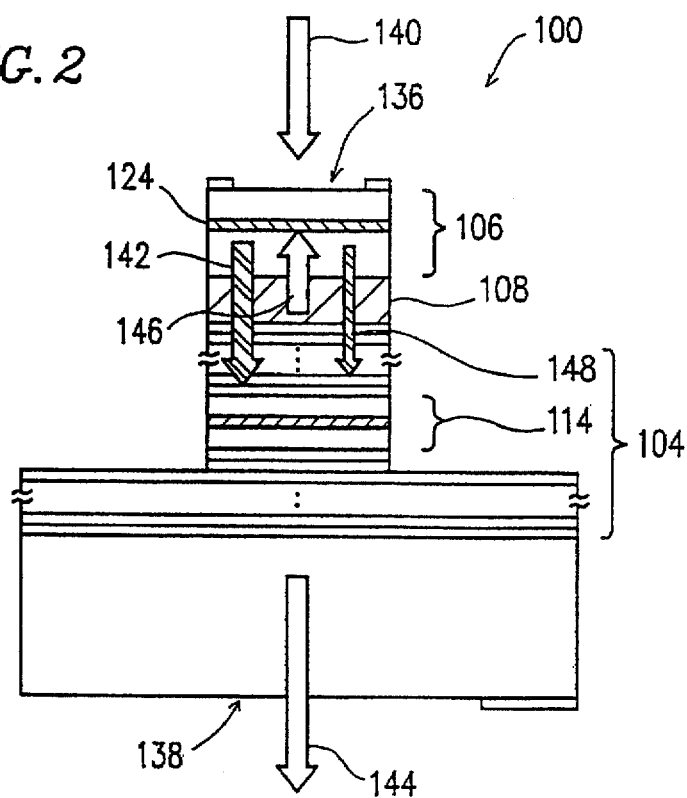
FIG. 2 is a schematic cross-sectional view illustrating the operation of the optoelectronic integrated device shown in FIG. 1.

Next, referring to FIGS. 1 and 2, the operation of the optoelectronic integrated device 100 will be described.

When incident light 140 having a wavelength of 0.98 μm is incident through the opening 136 onto the phototransistor 106, the incident light 140 is absorbed into the base layer 124 and the collector layer 122 so that a photoelectric current 142 flows in accordance with the intensity of the light 140. The photoelectric current 142 flows as a driving current through the vertical-cavity surface-emitting semiconductor laser 104 via the semiconductor buffer structure 108. If a driving current exceeding a threshold current flows, then the vertical-cavity surface-emitting semiconductor laser 104 oscillates and emits the light 144 having a wavelength of 0.98 μm from the active region 114. The vertical-cavity surface-emitting semiconductor laser 104 also emits internal feedback light 146 to the phototransistor 106. The internal feedback light 146 incident on the phototransistor 106 further generates a photoelectric current 148. As a result, the emitted light 144 and the internal feedback light 146 are further intensified. As is apparent from FIG. 2, the phototransistor 106 is preferably formed above the vertical-cavity surface-emitting semiconductor laser 104 so that the internal feedback light 146 is effectively incident onto the phototransistor 106.

Figure 3A:
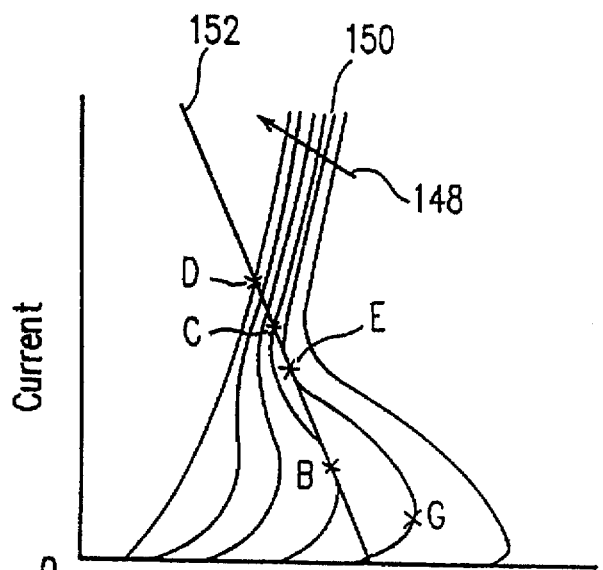
FIG. 3A is a graph showing the current-voltage characteristics of the optoelectronic integrated device shown in FIG. 1.
Figure 3B:
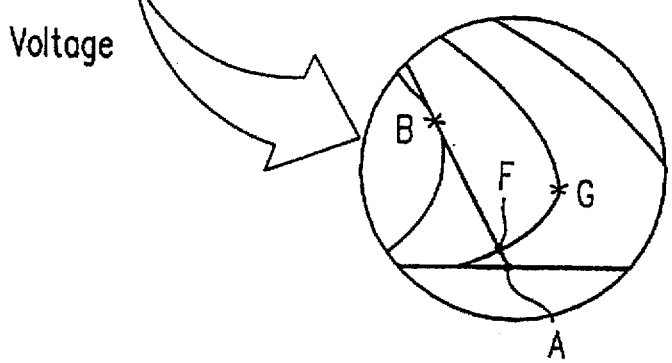
FIG. 3B is an enlarged view of a portion of FIG. 3A.

FIGS. 3A and 3B show current-voltage characteristics resulting from the variation of the intensity of the light 140 incident onto the optoelectronic integrated device 100 operating in the above-described manner. The arrow 148 in FIG. 3A indicates the order of the magnitude in the intensities of the incident light 140 resulting in the plurality of curves showing the current-voltage characteristics.

In the optoelectronic integrated device 100, as indicated by the curve 150, as a voltage increases, a current begins to flow and gradually increases. However, the optoelectronic integrated device 100 operates from the point G so that the current increases as the voltage decreases. This result shows that the internal resistance of the optoelectronic integrated device 100 has substantially been reduced, and that the optoelectronic integrated device 100 has a negative resistivity.

By selecting an appropriate load curve with respect to such current-voltage characteristics, an optically bistable state is realized in the optoelectronic integrated device 100. For example, if a load line 152 shown in FIG. 3 is selected, the optoelectronic integrated device 100 operates as explained below.

Initially, when no input light irradiates onto the optoelectronic integrated device 100, the optoelectronic device 100 operates under the condition which has a relation between a current and a voltage shown by point A, that is, an operation point is shown by point A. When the input light irradiates onto the optoelectronic integrated device 100, the operation point moves along the load line 152 as the intensity of the input light increases. When the operation point reaches point B, the operation point jumps to point C. Then, the operation point moves again along the load line 152 as the intensity of the input light increases, and reaches point D.

In contrast, the operation point moves back from point D to point E via point C along the load line 152 as the intensity of input light decreases. The operation point then reaches point E and jumps to point F. The operation point further moves again along the load line 152 as the intensity of the input light decreases, and reaches to point A when the intensity of the input light becomes zero.

Figure 4:
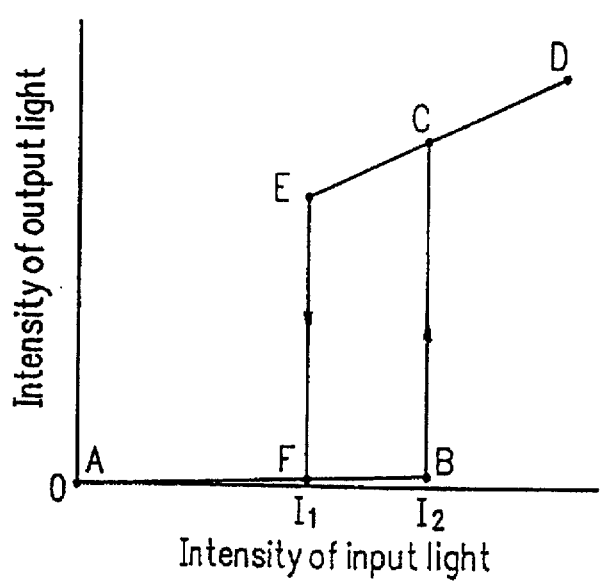
FIG. 4 is a graph showing the relationship between the incident light and the emitted light in the optoelectronic integrated device shown in FIG. 1.

FIG. 4 shows the relationship between the intensity of the input light and the intensity of the output light during the above-mentioned operation. In FIG. 4, points A to F correspond to the respective points shown in FIG. 3. As shown in FIG. 4, in the case where the intensity of the input light becomes greater than the intensity $I_2$, the optoelectronic integrated device 100 is in an on-state. In this case, a current at point C is greater than a threshold current of the vertical-cavity surface-emitting semiconductor laser 104, and therefore a laser oscillation occurs in optoelectronic integrated device 100. On the contrary, in the case where the intensity of the input light becomes smaller than the intensity $I_1$, the optoelectronic integrated device 100 is in an off-state. Thus, the optoelectronic integrated device 100 can be provided with two stable states between the intensity $I_1$ and the intensity $I_2$. Such a feature is called a bistable state characteristics. Optical digital processing can be realized using the optoelectronic integrated device 100 by corresponding these two stable states respectively to "0" and "1" by digital processing.

As described above, in this example, by introducing a semiconductor buffer structure made of InGaAs in which the composition ratios of In and Gas are varied between the phototransistor and the vertical-cavity surface-emitting semiconductor laser, it is possible to stack a heterojunction phototransistor of an InGaAs/InAlAs system over the vertical-cavity surface-emitting semiconductor laser using an InGaAs/GaAs strained quantum well as an active layer. As a result, in an optoelectronic integrated device, the light having the same wavelength as that of the incident light can be emitted and a plurality of optoelectronic integrated devices can be connected in series. In addition, an optical bistable characteristic can also be realized.

Moreover, the substrate is transparent with respect to the light oscillated from the vertical-cavity surface-emitting semiconductor laser. Therefore, by stacking a heterojunction phototransistor over the vertical-cavity surface-emitting semiconductor laser, it is possible to receive the incident light from the top surface of the semiconductor substrate on which an optoelectronic integrated device is formed and emit the light from the bottom surface of the substrate. As a result, the optical axis of the incident light can be aligned with that of the emitted light, the optoelectronic integrated device of the invention can be provided along the progressing direction of the light, and a plurality of optoelectronic integrated devices can be directly stacked.

Moreover, ports for the incident light and the emitted light can be easily provided for the top and bottom surfaces of the semiconductor substrate, so that the configuration of a connector for connecting an optical fiber to the optoelectronic integrated device can be simplified.

EXAMPLE 2

Figure 5:
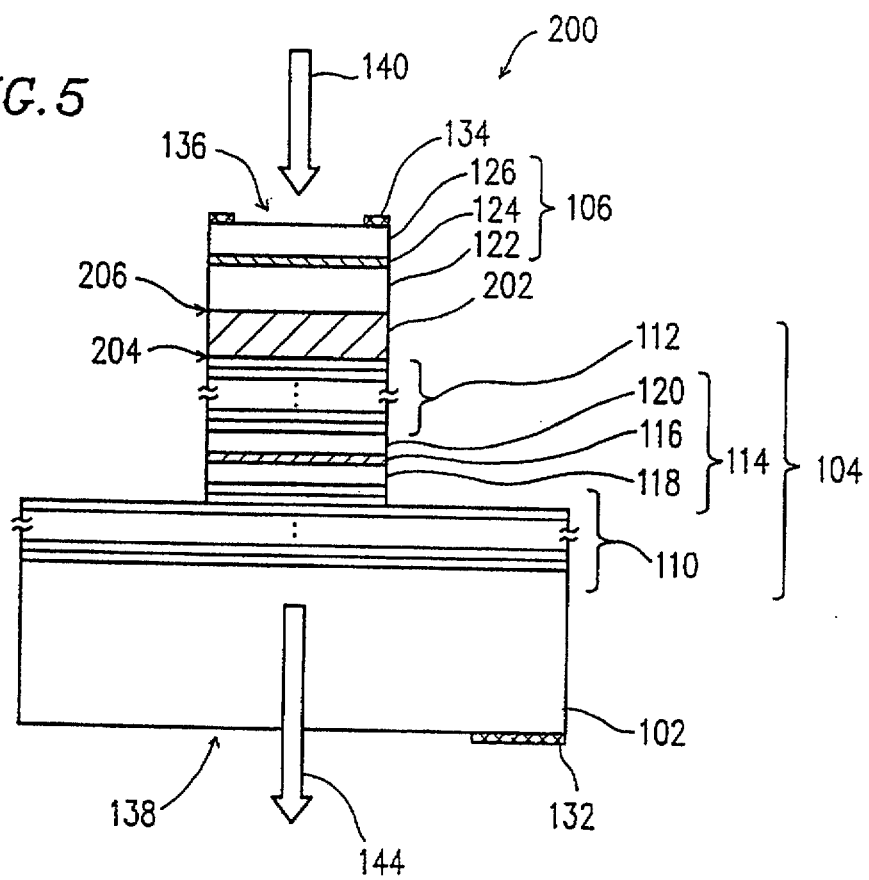
FIG. 5 is a schematic cross-sectional view of an optoelectronic integrated device according to a second example of the present invention.

FIG. 5 schematically shows the cross section of an optoelectronic integrated device 200 according to a second example of the invention.

Figure 6:
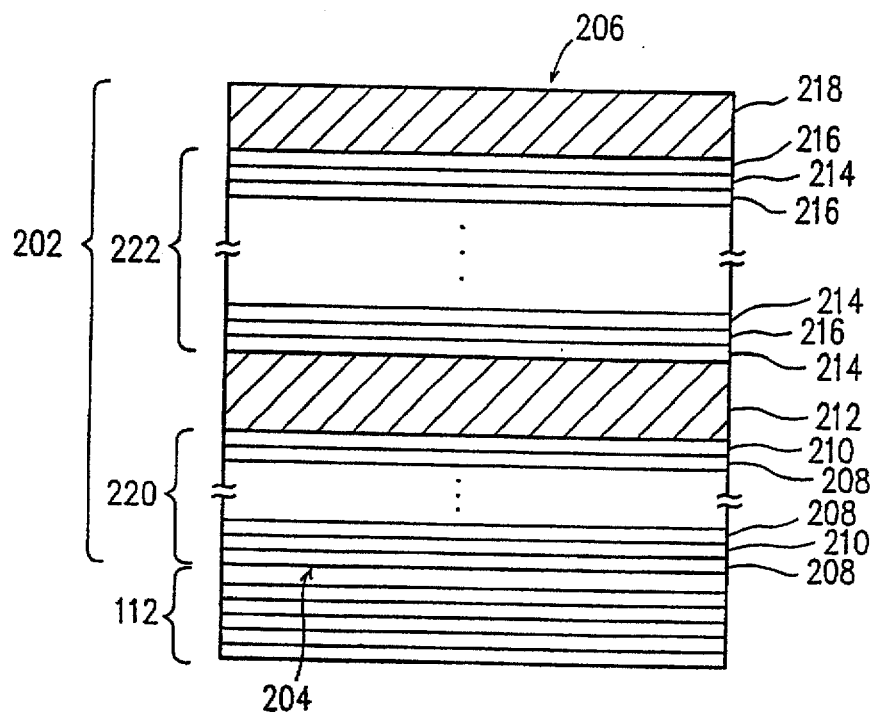
FIG. 6 is a schematic cross-sectional view illustrating in detail a semiconductor buffer structure of the optoelectronic integrated device shown in FIG. 5.

The optoelectronic integrated device 200 of the second example is different from the optoelectronic integrated device 100 of the first example in that the optoelectronic integrated device 200 includes a semiconductor buffer structure 202 different from the semiconductor buffer structure 108 shown in FIG. 1. In FIG. 5, the same components as those of the optoelectronic integrated device 100 of the first example shown in FIG. 1 are denoted by the same reference numerals. The semiconductor buffer structure 202 includes a superlattice buffer layer in which a plurality of semiconductor layers having a thickness equal to or smaller than the critical film thickness are stacked. FIG. 6 shows an example of a specific semiconductor buffer structure 202. As shown in FIG. 6, the semiconductor buffer structure 202 includes: superlattice layers 220 and 222; an n-type $In_{0.26}Ga_{0.74}As$ layer 212 (thickness: 200 nm; impurity concentration: $1 \times 10^{18}$ $cm^{-3}$); and an n-type $In_{0.53}Ga_{0.47}As$ layer 218 (thickness: 200 nm; impurity concentration: $1 \times 10^{18}$ $cm^{-3}$).

The top semiconductor mirror 112 formed by a GaAs layer and an AlAs layer does not lattice-match with the n-type $In_{0.26}Ga_{0.74}As$ layer 212 and the n-type $In_{0.53}Ga_{0.47}As$ layer 218. However, the superlattice layer 220 is provided between the top semiconductor mirror 112 and the n-type $In_{0.26}Ga_{0.74}As$ layer 212, and the superlattice layer 222 is provided between the n-type $In_{0.26}Ga_{0.74}As$ layer 212 and the n-type $In_{0.53}Ga_{0.47}As$ layer 218. Therefore, the lattice strain is relieved and the introduction of the misfit dislocation can be avoided, and a surface 206 having a lattice constant which is not equal to that of the top semiconductor mirror 112 but to that of the base layer 124 of the phototransistor 106 can be provided. In the superlattice layer 220, fifty n-type GaAs layers 208 (thickness: 2 nm; impurity concentration: $1 \times 10^{18}$ $cm^{-3}$) and fifth n-type $In_{0.26}Ga_{0.74}As$ layers 210 (thickness: 2 nm; impurity concentration: $1 \times 10^{18}$ $cm^{-3}$) are alternately stacked to form fifty pairs. On the other hand, in the superlattice layer 222, fifty pairs of n-type $In_{0.26}Ga_{0.74}As$ layers 214 (thickness: 2 nm; impurity concentration: $1 \times 10^{18}$ $cm^{-3}$) and n-type $In_{0.53}Ga_{0.47}As$ layers 216 (thickness: 2 nm; impurity concentration: $1 \times 10^{18}$ $cm^{-3}$) are alternately stacked.

By using a semiconductor buffer structure including such superlattice layers, it is also possible to stack a heterojunction phototransistor of an InGaAs/InAlAs system over the vertical-cavity surface-emitting semiconductor laser using an InGaAs/GaAs strained quantum well as an active layer. As a result, as described in the first example, in an optoelectronic integrated device, the wavelength of the emitted light can equalize with that of the incident light, and a plurality of optoelectronic integrated devices can be connected in series. In addition, an optical bistable characteristic can also be realized.

Alternatively, a semiconductor buffer structure having a different configuration from those described in the above examples can also be used for the optoelectronic integrated device of the invention. For example, a semiconductor buffer structure made of the same material as that of the base layer 124 of the phototransistor 106 can also be used. In such a case, the material constituting the base layer 124 does not lattice-match with the material constituting the top semiconductor mirror 112. Therefore, if a semiconductor buffer structure is stacked on the top semiconductor mirror 112, the resulting semiconductor layer contains much misfit dislocation. However, if a semiconductor layer having a sufficient thickness (several µm) is stacked as a semiconductor buffer structure, then a semiconductor buffer structure having a satisfactory surface including little lattice defect or the like with the misfit dislocation reduced can be obtained.

EXAMPLE 3

Figure 7:
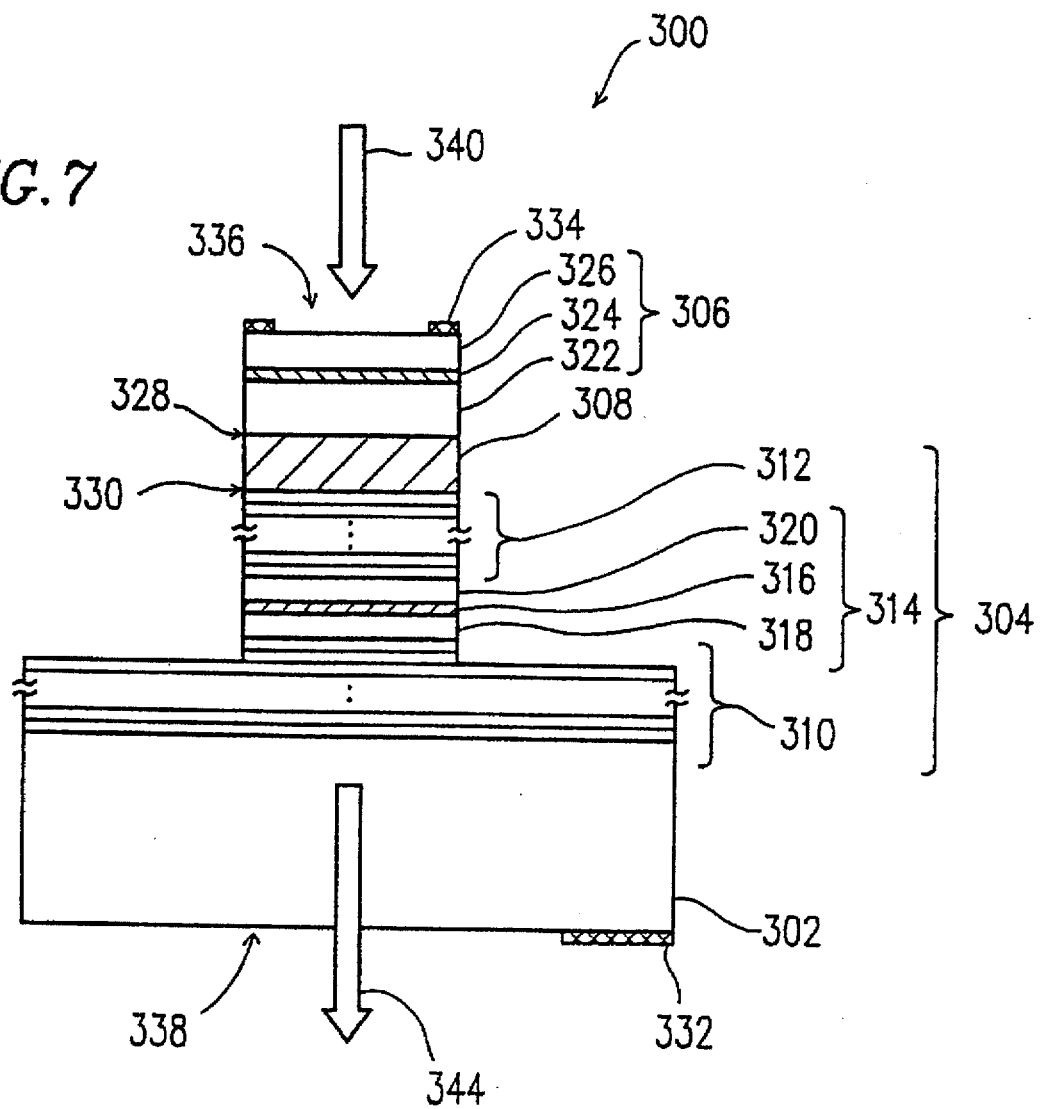
FIG. 7 is a schematic cross-sectional view of an optoelectronic integrated device according to a third example of the present invention.

FIG. 7 schematically shows the cross section of an optoelectronic integrated device 300 according to a third example of the invention. In this example, an optoelectronic integrated device using a Group II–VI semiconductor will be described.

The optoelectronic integrated device 300 includes: a semiconductor substrate 302; a vertical-cavity surface-emitting semiconductor laser 304 formed on the semiconductor substrate 302; a phototransistor 306; and a semiconductor buffer structure 308 provided between the vertical-cavity surface-emitting semiconductor laser 304 and the phototransistor 306.

The semiconductor substrate 302 is made of p-type GaAs. The lattice constant of GaAs having the bulk structure is 5.65 Å.

The vertical-cavity surface-emitting semiconductor laser 304 includes: a bottom semiconductor mirror 310 formed on the semiconductor substrate 302; a top semiconductor mirror 312; and an active region 314 interposed between the bottom semiconductor mirror 310 and the top semiconductor mirror 312. The bottom semiconductor mirror 310 has a multi-layered structure obtained by alternately stacking 24.5 pairs of p-type GaAs layers and p-type AlAs layers, thereby forming a distributive reflector. In the same way, the top semiconductor mirror 312 also has a multi-layered structure obtained by alternately stacking 24.5 pairs of n-type GaAs layers and n-type AlAs layers, thereby forming a distributive reflector.

The active region 314 has a strained quantum well structure and includes a strained quantum well 316 and a pair of cladding layers 318 and 320. More specifically, the cladding layers 318 and 320 are made of ZnMgSSe, and interpose the strained quantum well 316. The strained quantum well 316 includes a pair of barrier layers made of ZnSe and a well layer which is interposed between the barrier layers and made of $Cd_{0.18}Zn_{0.82}Se$. The well layer has a smaller bandgap than that of barrier layer, therefore, carriers are confined in the well layer by the barrier layers. ZnMgSSe and ZnSe in the bulk structure have substantially the same lattice constant as that of GaAs, but $Cd_{0.18}Zn_{0.82}Se$ in the bulk structure has larger lattice constant than that of GaAs. Thus, a semiconductor layer made of $Cd_{0.18}Zn_{0.82}Se$ in a bulk state does not lattice-match with a semiconductor layer made of GaAs, ZnMgSSe or ZnSe. However, since the well layer of the strained quantum well 316 has a thickness equal to or smaller than the critical film thickness at which a bulk property is no longer exhibited, the well layer is epitaxially grown on the barrier layer as a strained layer not having a misfit dislocation. The strained quantum well 316 having a strained structure oscillates the light having a wavelength of 0.51 µm, and the semiconductor substrate 302 is transparent with respect to this light.

Of these semiconductor layers constituting the vertical-cavity surface-emitting semiconductor laser 304, all the layers but the well layer of the strained quantum well 316 have substantially the same lattice constant as that of the semiconductor substrate 302, and therefore these layers lattice-match with the semiconductor substrate 302.

The phototransistor 306 includes a collector layer 322 an emitter layer 326 and a base layer 324 interposed between the collector layer 322 and the emitter layer 326. The collector layer 322 and the base layer 324 are made of n-type CdZnSe and p-type CdZnSe, respectively. The base layer 324 absorbs the light having substantially the same wavelength as that of the light emitted from the strained quantum well 316. The emitter layer 326 is made of n-type CdZnSSe having a bandgap larger than that of the base layer 324, and a heterojunction is formed in the interface between the base layer 324 and the emitter layer 326. Both the collector layer 322 and the emitter layer 326 lattice-match with the base layer 324 and have substantially the same lattice constant.

Figure 8:
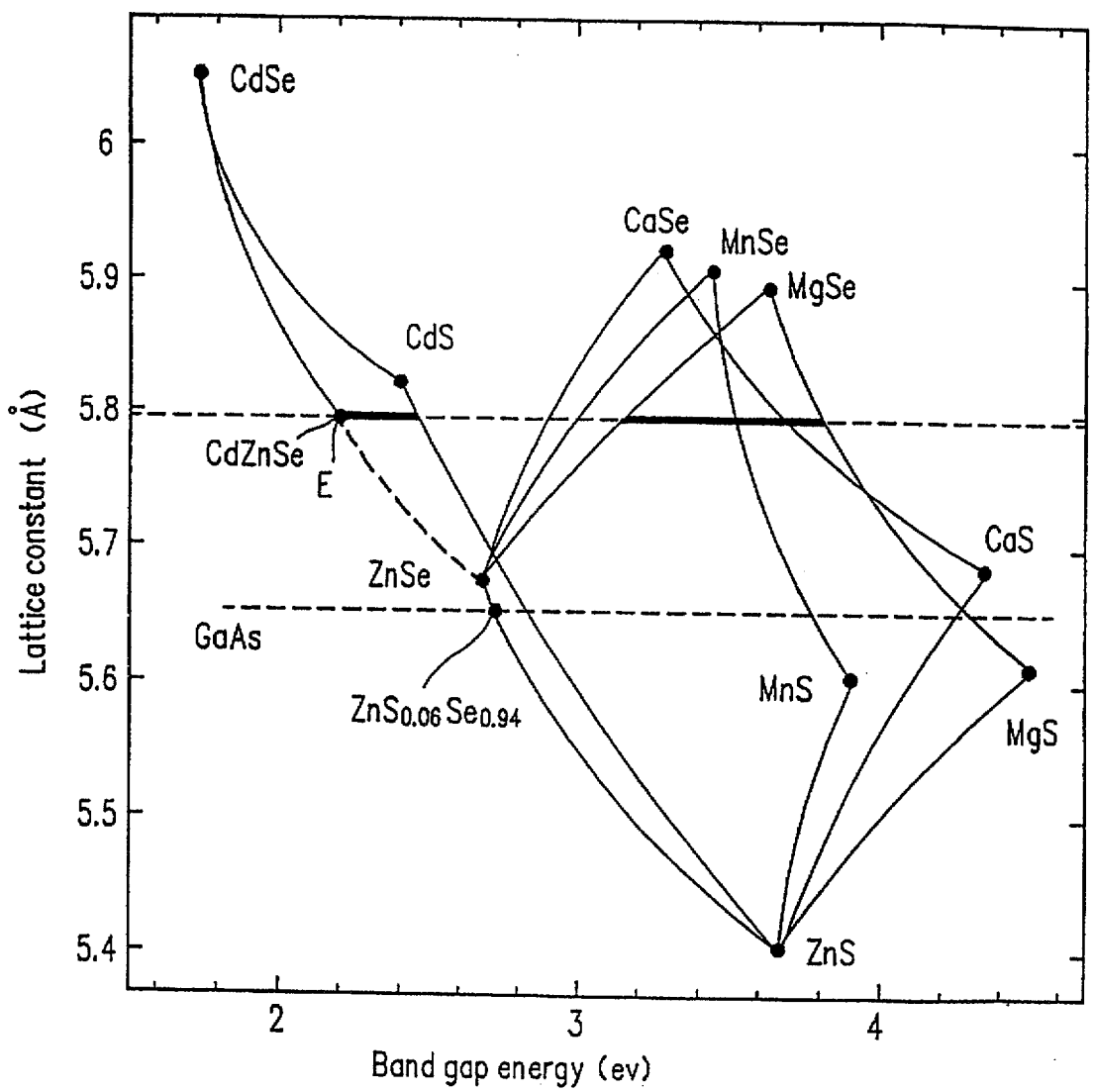
FIG. 8 is a graph showing the relationship between the bandgap energies and the lattice constants of Group II–IV semiconductors.

FIG. 8 shows the relationships between the bandgap energies and the lattice constants of the group II–VI semiconductors according to the invention. As shown in FIG. 8, a plurality of semiconductors having the same lattice constant and different compositions exist among the II–VI semiconductors. Accordingly, if the emitter layer 326 has substantially the same lattice constant as that of the base layer 324, then arbitrary semiconductors in the ranges indicated by the solid lines in FIG. 8 can be selected.

In the semiconductor buffer structure 308, the composition of the semiconductor is varied continuously or in discrete steps so that the lattice constant thereof is equal to the lattice constant of GaAs on the second surface 330 facing the vertical-cavity surface-emitting semiconductor laser 304 and that the lattice constant thereof is equal to the lattice constant of CdZnSe on the first surface 328 facing the phototransistor 306. More specifically, as indicated by the broken line in FIG. 8, the semiconductor buffer structure 308 is made of $Cd_xZn_{1-x}S_ySe_{1-y}$, and the composition ratios x and y vary continuously or in discrete steps. On the second surface 330, the semiconductor buffer structure 308 is made of a semiconductor where x is 0 and y is 0.06, and the composition ratio y gradually decreases so as to be 0 on the first surface 328 while the composition ratio x remains 0. After the composition becomes ZnSe, the composition ratio y remains 0, but the composition ratio x is varied to 0.2. As a result, the composition becomes $Cd_{0.2}Zn_{0.8}Se$ on the first surface 328.

Therefore, the semiconductor buffer structure 308 on the first surface 328 is made of the same semiconductor material as that of the collector layer 322 or the base layer 324, and has a lattice constant substantially lattice-matching with the base layer 324. On the other hand, the semiconductor buffer structure 308 on the second surface 330 is made of CdZnSe, and therefore, lattice-matches with the top semiconductor mirror 312 of the vertical-cavity surface-emitting semiconductor laser 304. Also, since the semiconductor composition continuously or gradually varies in the semiconductor buffer structure 308, the internal strain caused by lattice-mismatch has been sufficiently relieved.

The optoelectronic integrated device 300 further includes a p-type electrode 332 and an n-type electrode 334. The p-type electrode 332 is formed so as to provide an opening 338 for the bottom surface of the semiconductor substrate 302, and the n-type electrode 334 is formed so as to provide an opening 336 for the top surface of the emitter layer 326.

In this example, by introducing a semiconductor buffer structure made of $Cd_xZn_{1-x}S_ySe_{1-y}$, in which the composition of the semiconductors varies continuously, between the phototransistor and the vertical-cavity surface-emitting semiconductor laser, it is possible to stack a heterojunction phototransistor of a CdZnSe/CdZnSSe system over the vertical-cavity surface-emitting semiconductor laser using a CdZnSe/ZnSe strained quantum well as an active layer.

As described in the first example, in an optoelectronic integrated device, the wavelength of the emitted light can be equalized with that of the incident light, and a plurality of optoelectronic integrated devices can be connected in series. In addition, an optical bistable characteristic can also be realized.

EXAMPLE 4

Figure 9:
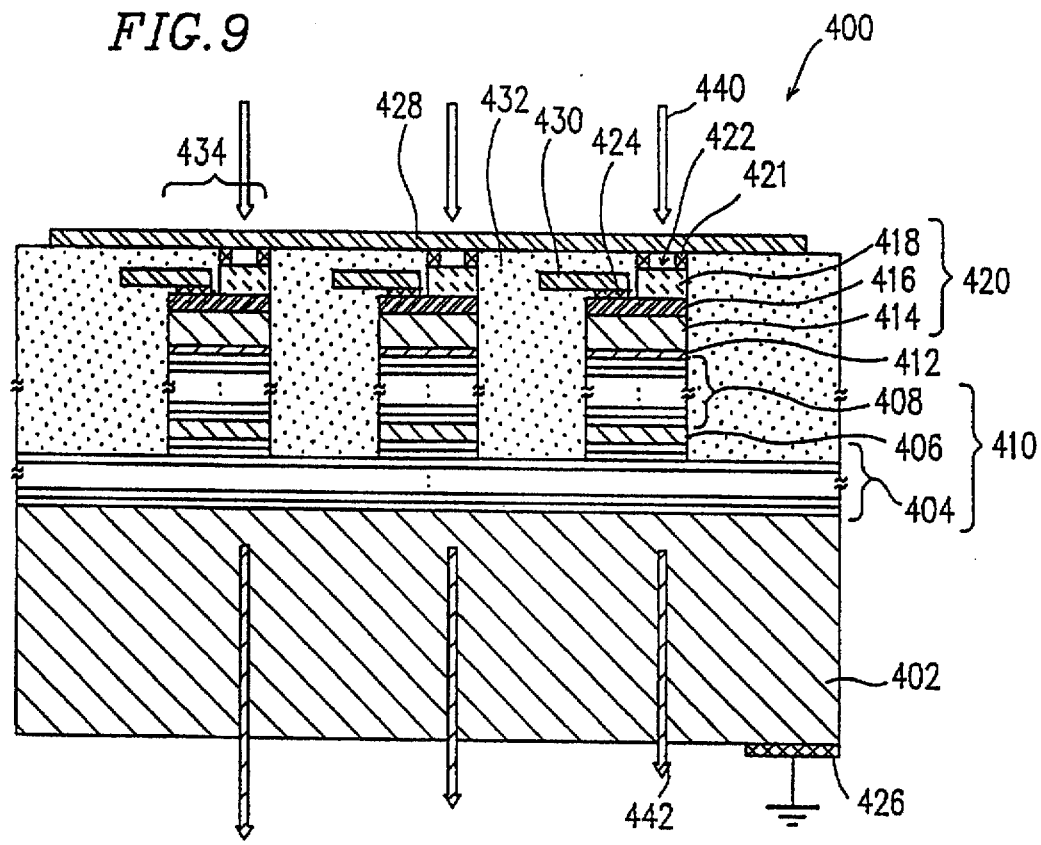
FIG. 9 is a partial cross-sectional view of an optoelectronic integrated circuit according to a fourth example of the present invention.
Figure 10:
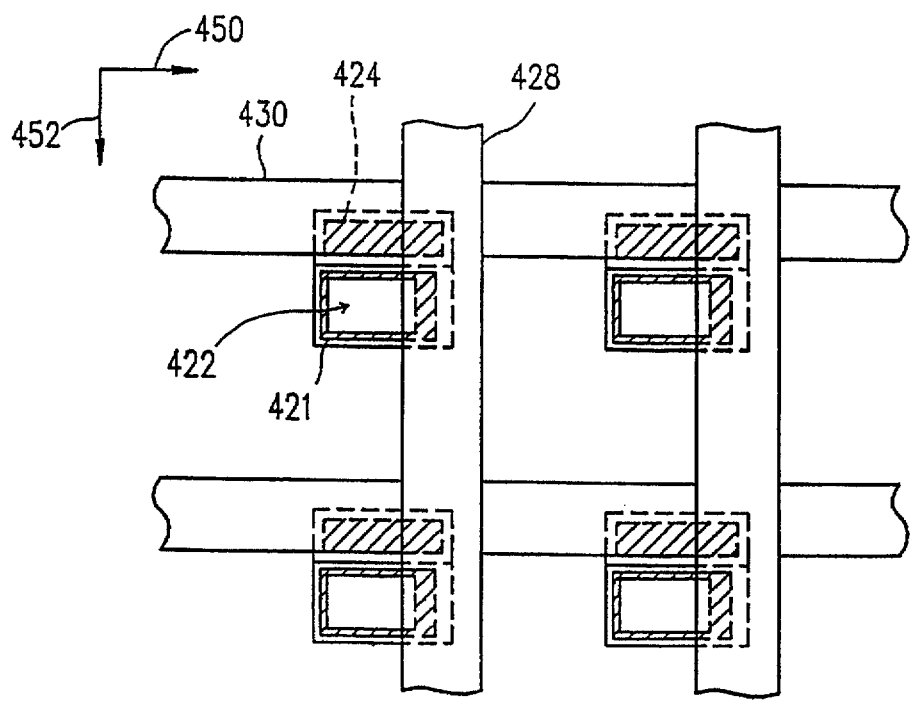
FIG. 10 is a partial plan view of the optoelectronic integrated circuit shown in FIG. 9.
Figure 11:
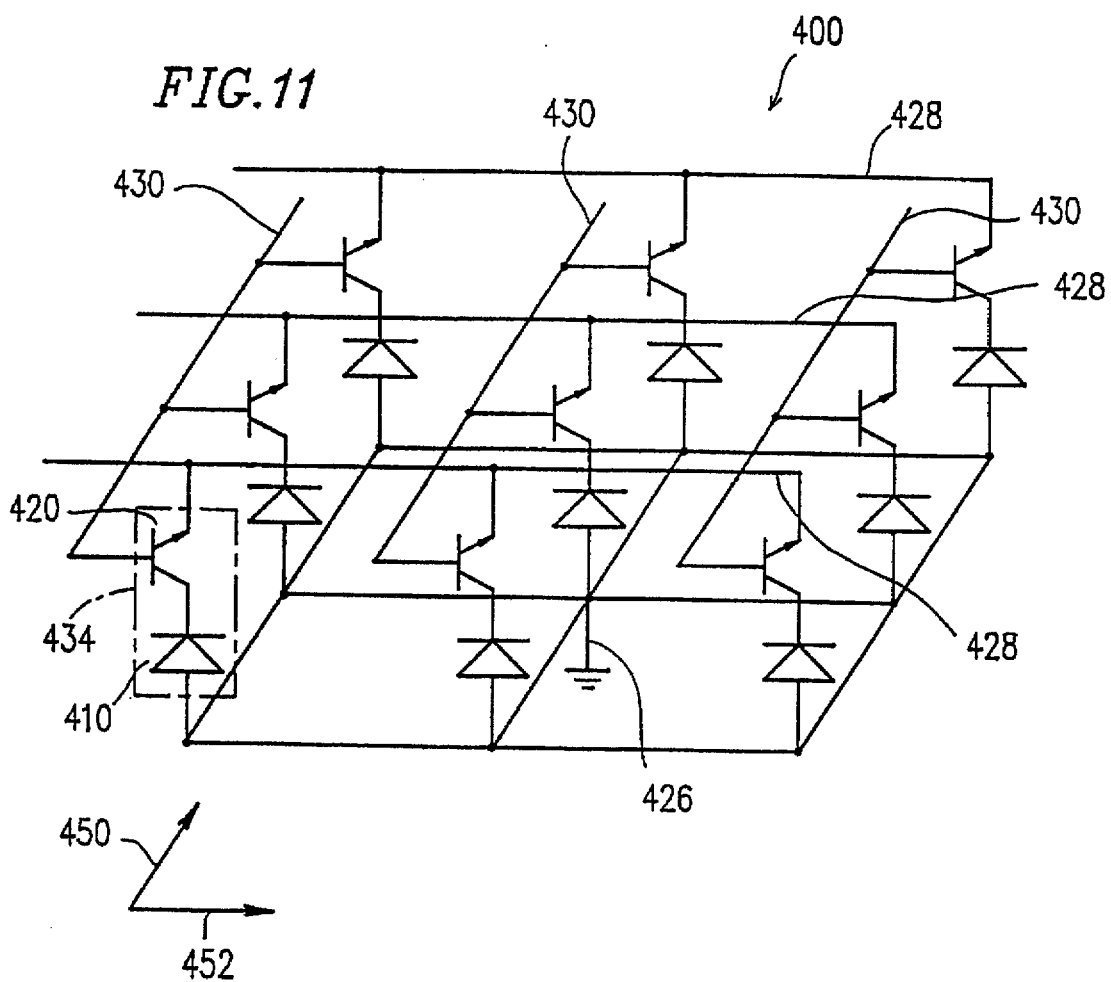
FIG. 11 is a three-dimensional view showing an equivalent circuit of the optoelectronic integrated circuit shown in FIG. 9.

FIG. 9 is a partial cross-sectional view of an optoelectronic integrated circuit 400 according to a fourth example of the invention. FIG. 10 is a plan view showing the main portion thereof. FIG. 11 three-dimensionally shows an equivalent circuit of the optoelectronic integrated circuit 400 shown in FIG. 9.

The optoelectronic integrated circuit 400 includes a plurality of optoelectronic integrated devices 434 of any of the first, second and third examples as unit cells. The respective optoelectronic integrated devices 434 are arranged in a two-dimensional array along a first direction 450 and a second direction 452. Each optoelectronic integrated device 434 includes: a semiconductor substrate 402; a vertical-cavity surface-emitting semiconductor laser 410 formed on the semiconductor substrate 402; a phototransistor 420 stacked over the vertical-cavity surface-emitting semiconductor laser 410; and a semiconductor buffer structure 412 provided between the vertical-cavity surface-emitting semiconductor laser 410 and the phototransistor 420.

The vertical-cavity surface-emitting semiconductor laser 410, the phototransistor 420 and the semiconductor buffer structure 412 have the same configurations as those described in the above examples. More specifically, the vertical-cavity surface-emitting semiconductor laser 410 includes: a bottom semiconductor mirror 404; a top semiconductor mirror 408; and an active region 406, interposed between the bottom semiconductor mirror 404 and the top semiconductor mirror 408, having a strained quantum well structure for emitting the light having a wavelength of λ. The phototransistor 420 includes: a collector layer 414; an emitter layer 418; and a base layer 416, interposed between the collector layer 414 and the emitter layer 418, absorbing the light having a wavelength of λ. In the semiconductor buffer structure 412, the top surface thereof facing the − phototransistor 420 has a lattice constant substantially lattice-matching with the base layer 416. A base electrode 424 is provided on the base layer 416, and a substrate electrode 426 is provided on the semiconductor substrate 402. An emitter electrode 421 is provided on the emitter layer 418 so as to provide an opening 422 for the top surface of the emitter layer 418.

The optoelectronic integrated circuit 400 further includes: a plurality of first lines 430 for electrically connecting via the base electrodes 424 the base layers 416 of the phototransistors 420 of the optoelectronic integrated devices 434 which are adjacent to each other along the first direction 450; and a plurality of second lines 428 for electrically connecting via the emitter electrodes 421 the emitter layer 418 of the − phototransistors 420 of the optoelectronic integrated devices 434 which are adjacent to each other along the second direction 452. The first lines 430 are retained, being embedded in an interlevel insulating film 432 provided so as to fill the mesa portions of the respective optoelectronic integrated devices 434, while the second lines 428 are provided on the interlevel insulating film 432.

By grounding the substrate electrode 426 and applying a predetermined voltage to the second lines 428, when the incident light 440 is incident through the openings 422 on the phototransistors 420 of the respective optoelectronic integrated devices 434, the vertical-cavity surface-emitting semiconductor laser 410 emits the light having substantially the same wavelength as that of the incident light 440 as the emitter light 442, as described in the first example.

In this case, by applying a bias voltage to the base layer 416 via the first lines 430, the sensitivity of the phototransistor 420 can be adjusted. The response speed of the phototransistor 420 can be also enhanced.

Figure 12B:
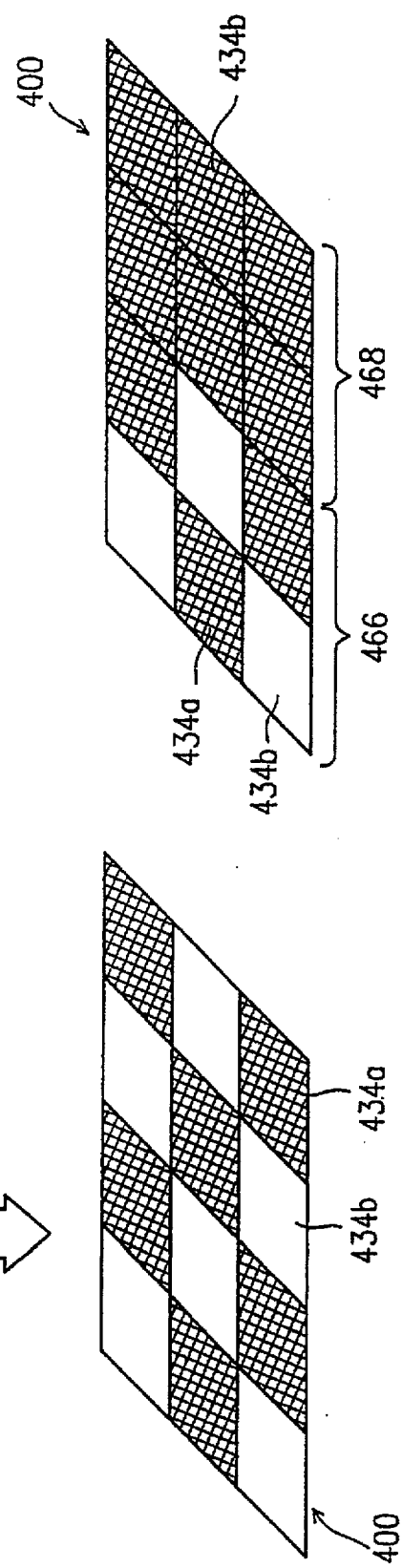
FIG. 12B is another schematic view illustrating a method of processing two-dimensional information using the optoelectronic integrated circuit shown in FIG. 9.
Figure 12A:
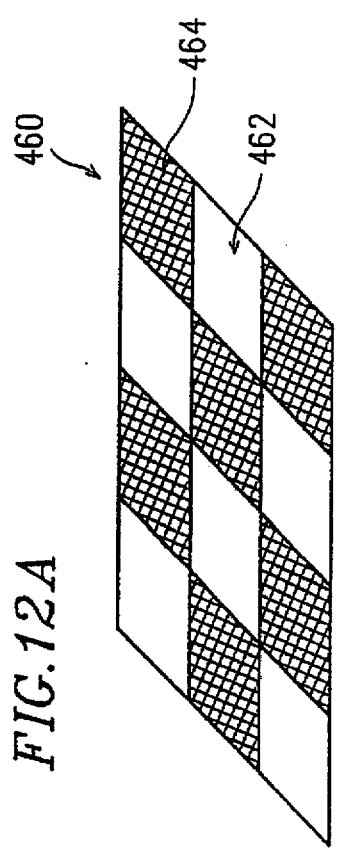
FIG. 12A is a schematic view illustrating a method of processing two-dimensional information using the optoelectronic integrated circuit shown in FIG. 9.
Figure 13:
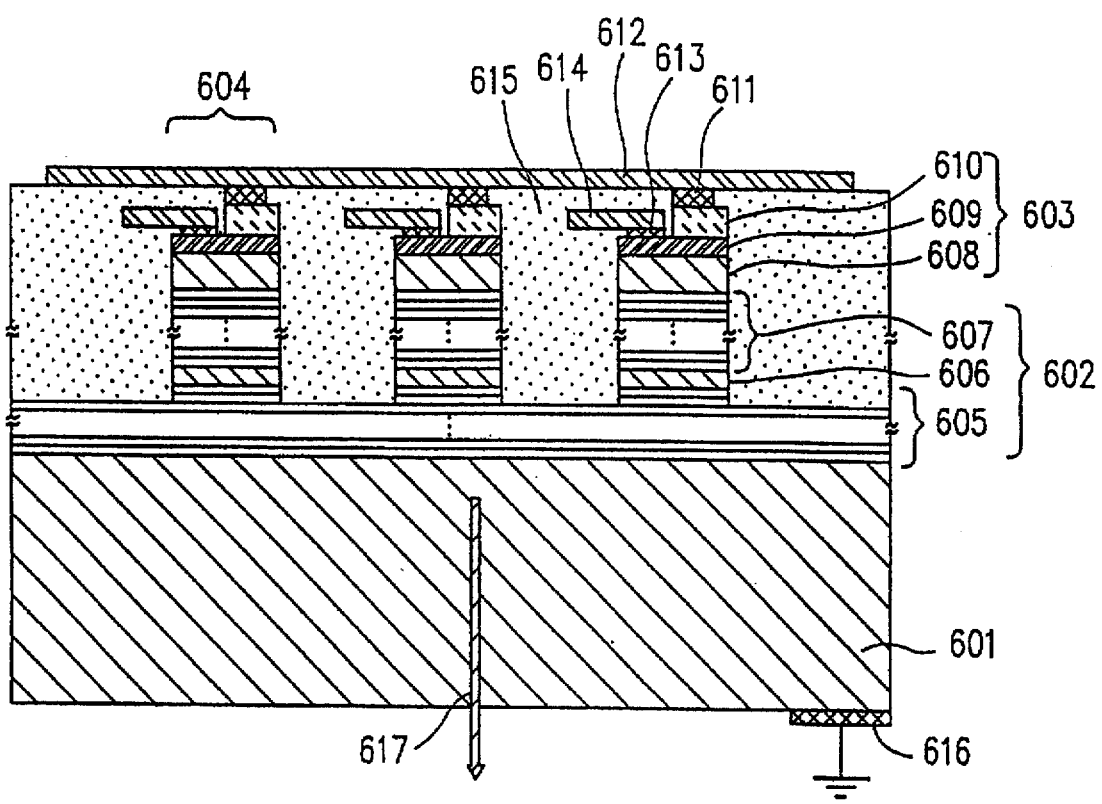
FIG. 13 is a partial cross-sectional view of a conventional optoelectronic integrated circuit.

The optoelectronic integrated circuit 400 can process an image consisting of two-dimensional information without converting the image into one-dimensional information. As is schematically shown in FIG. 12A, an image 460 consists of regions 462 which emit sufficiently strong light so that the optoelectronic integrated device 434 becomes an on-state and regions 464 which do not emit substantial light. When the optoelectronic integrated circuit 400 receive the image 460 as input light, the optoelectronic integrated devices 434b corresponding to the regions 462 becomes an on-state and the optoelectronic integrated devices 434a corresponding to the regions 464 becomes an off-state. Thus, the optoelectronic integrated circuit 400 can record the image 460 directly as two-dimensional information.

Further, a part of the image 460 can be recorded or extracted by application of a base bias voltage. As is schematically shown in FIG. 12B, the optoelectronic integrated circuit 400 is divided into a region 466 and a region 468. The region 466 includes the optoelectronic integrated devices 434 in which the base layer is applied with an appropriate biased voltage, and the region 468 includes the optoelectronic integrated devices 434 in which the base layer is not biased. When the optoelectronic integrated circuit 400 receives the image 460 as input light, the optoelectronic integrated devices 434 in the region 468 are masked from the image 460 and do not become an on-state. Therefore, only a part of the image 460 is recorded or extracted by the optoelectronic integrated circuit 400.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An optoelectronic integrated device comprising:
   a semiconductor substrate;
   a vertical-cavity surface-emitting semiconductor laser formed on the semiconductor substrate, the vertical-cavity surface-emitting semiconductor laser including: a bottom semiconductor mirror; a top semiconductor mirror; and an active region interposed between the bottom semiconductor mirror and the top semiconductor mirror, the active region having a strained quantum well structure for emitting light having a wavelength of λ;
   a phototransistor stacked over the vertical-cavity surface-emitting semiconductor laser, for driving the vertical-cavity surface-emitting semiconductor laser, the phototransistor including: a collector layer; an emitter layer; and a base layer interposed between the collector layer and the emitter layer, the base layer absorbing the light having the wavelength of λ; and
   a semiconductor buffer structure interposed between the vertical-cavity surface-emitting semiconductor laser and the phototransistor, the semiconductor buffer structure including: a first surface facing the phototransistor and having a lattice constant substantially lattice-matching with the base layer; and a second surface facing the vertical-cavity surface-emitting semiconductor laser.

2. An optoelectronic integrated device according to claim 1, wherein the semiconductor substrate is made of a material substantially transmitting the light having the wavelength of λ.

3. An optoelectronic integrated device according to claim 2, wherein the active region has the strained quantum well structure comprising an InGaAs layer and a GaAs layer, and the collector layer and the base layer are formed by InGaAs layers.

4. An optoelectronic integrated device according to claim 3, wherein the emitter layer is formed by an InAlAs layer.

5. An optoelectronic integrated device according to claim 3, wherein the semiconductor buffer structure is formed by an $In_xGa_{1-x}As$ layer, and a composition ratio x of In and a composition ratio 1-x of Ga vary continuously or in discrete steps from the second surface to the first surface of the semiconductor buffer structure so that a composition of the semiconductor buffer structure has the composition ratio x of zero on the second surface and becomes equal to a composition of the collector layer on the first surface.

6. An optoelectronic integrated device according to claim 3, wherein the semiconductor buffer structure has a superlattice structure in which at least two of an $Al_xGa_{1-x}As$ layer (where, $0 \leq x \leq 1$), an $In_yGa_{1-y}As$ layer (where, $0 \leq y \leq 1$), and an $In_zAl_{1-z}As$ layer (where, $0 \leq z \leq 1$) are alternately stacked.

7. An optoelectronic integrated device according to claim 1, wherein the optoelectronic integrated device is driven so that an electric current flows through the phototransistor when the light having the wavelength of λ is incident on the base layer and that the light having the wavelength of λ is emitted from the vertical-cavity surface-emitting semiconductor laser.

8. An optoelectronic integrated device according to claim 7, wherein a part of the light having the wavelength of λ emitted from the vertical-cavity surface-emitting semiconductor laser is internally fed back to the base layer.

9. An optoelectronic integrated device according to claim 8, wherein the light emitted from the vertical-cavity surface-emitting semiconductor laser shows a bistable state with respect to the light incident on the base layer.

10. An optoelectronic integrated circuit comprising:

a semiconductor substrate; and a plurality of optoelectronic integrated devices arranged in a two-dimensional array along a first direction and a second direction on the semiconductor substrate;

wherein each of the plurality of optoelectronic integrated devices comprises:

a vertical-cavity surface-emitting semiconductor laser formed on the semiconductor substrate, the vertical-cavity surface-emitting semiconductor laser including: a bottom semiconductor mirror; a top semiconductor mirror; and an active region interposed between the bottom semiconductor mirror and the top semiconductor mirror, the active region having a strained quantum well structure for emitting light having a wavelength of $\lambda$;

a phototransistor stacked over the vertical-cavity surface-emitting semiconductor laser, for driving the vertical-cavity surface-emitting semiconductor laser, the phototransistor including: a collector layer; an emitter layer; and a base layer interposed between the collector layer and the emitter layer, the base layer absorbing the light having the wavelength of $\lambda$; and a semiconductor buffer structure interposed between the vertical-cavity surface-emitting semiconductor laser and the phototransistor, the semiconductor buffer structure including: a first surface facing the phototransistor and having a lattice constant substantially lattice-matching with the base layer; and a second surface facing the vertical-cavity surface-emitting semiconductor laser, the optoelectronic integrated circuit further comprising:

a plurality of first lines for electrically connecting to each other the base layers of the phototransistors of the plurality of optoelectronic integrated devices which are adjacent to each other along the first direction; and a plurality of second lines for electrically connecting to each other the emitter layers of the phototransistors of the plurality of optoelectronic integrated devices which are adjacent to each other along the second direction.

11. An optoelectronic integrated circuit according to claim 10, wherein the semiconductor substrate is made of a material substantially transmitting the light having the wavelength of $\lambda$.

12. An optoelectronic integrated circuit according to claim 11, wherein the active region has the strained quantum well structure comprising an InGaAs layer and a GaAs layer, and the collector layer and the base layer are formed by InGaAs layers.

13. An optoelectronic integrated circuit according to claim 12, wherein the emitter layer is formed by an InAlAs layer.

14. An optoelectronic integrated circuit according to claim 12, wherein the semiconductor buffer structure is formed by an $In_xGa_{1-x}As$ layer, and a composition ratio x of In and a composition ratio 1-x of Ga vary continuously or in discrete steps from the second surface to the first surface of the semiconductor buffer structure so that a composition of the semiconductor buffer structure has the composition ratio x of zero on the second surface and becomes the same composition as that of the collector layer on the first surface.

15. An optoelectronic integrated circuit according to claim 12, wherein the semiconductor buffer structure has a superlattice structure in which at least two of an $Al_xGa_{1-x}As$ layer (where, $0 \leq x \leq 1$), an $In_yGa_{1-y}As$ layer (where, $0 \leq y \leq 1$), and an $In_zAl_{1-z}As$ layer (where, $0 \leq z \leq 1$) are alternately stacked.

* * * * *

UNITED STATES PATENT AND TRADEMARK OFFICE
CERTIFICATE OF CORRECTION

PATENT NO.     : 5,679,964

DATED          : October 21, 1997

INVENTOR(S)    : Yasuhiro Kobayashi et al.

It is certified that error appears in the above-identified patent and that said Letters Patent is hereby corrected as shown below:

IN THE CLAIMS:

Claim 6, line 3, change "laser" to --layer--.

Signed and Sealed this

Twenty-first Day of April, 1998

*Attest:*

BRUCE LEHMAN

*Attesting Officer*          *Commissioner of Patents and Trademarks*